(12) United States Patent
Padilla et al.

(10) Patent No.: US 10,340,016 B2
(45) Date of Patent: Jul. 2, 2019

(54) METHODS OF ERROR-BASED READ DISTURB MITIGATION AND MEMORY DEVICES UTILIZING THE SAME

(71) Applicant: Micron Technology, Inc., Boise, ID (US)

(72) Inventors: Renato C. Padilla, Folsom, CA (US); Jung Sheng Hoei, Newark, CA (US); Michael G. Miller, Boise, ID (US); Roland J. Awusie, Boise, ID (US); Sampath K. Ratnam, Boise, ID (US); Kishore Kumar Muchherla, Fremont, CA (US); Gary F. Besinga, Boise, ID (US); Ashutosh Malshe, Fremont, CA (US); Harish R. Singidi, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 15/633,377

(22) Filed: Jun. 26, 2017

(65) Prior Publication Data
US 2018/0374549 A1 Dec. 27, 2018

(51) Int. Cl.
*G11C 16/34* (2006.01)
*G11C 11/56* (2006.01)
(52) U.S. Cl.
CPC ...... *G11C 16/3427* (2013.01); *G11C 16/3422* (2013.01); *G11C 16/3431* (2013.01); *G11C 11/5642* (2013.01)

(58) Field of Classification Search
CPC ........... G11C 16/3427; G11C 16/3431; G11C 16/3422; G11C 11/5642
See application file for complete search history.

(56) References Cited

U.S. PATENT DOCUMENTS

| 8,566,671 | B1 * | 10/2013 | Ye | G06F 11/1048 714/764 |
| 9,471,423 | B1 * | 10/2016 | Healy | G06F 11/1068 |
| 9,564,233 | B1 * | 2/2017 | Cho | G11C 16/3459 |
| 9,612,953 | B1 * | 4/2017 | Davis | G06F 3/0679 |
| 2013/0061101 | A1 * | 3/2013 | Fitzpatrick | G11C 16/349 714/718 |
| 2013/0346805 | A1 * | 12/2013 | Sprouse | G11C 16/3418 714/42 |
| 2014/0136883 | A1 * | 5/2014 | Cohen | G06F 11/2094 714/6.11 |

(Continued)

*Primary Examiner* — Mushfique Siddique
(74) *Attorney, Agent, or Firm* — Perkins Coie LLP

(57) ABSTRACT

A memory device comprising a main memory and a controller operably connected to the main memory. The main memory can comprise a plurality of memory addresses, each corresponding to a single one of a plurality of word lines. Each memory address can be included in a tracked subset of the plurality of memory addresses. Each tracked subset can include memory addresses corresponding to more than one of the plurality of word lines. The controller is configured to track a number of read operations for each tracked subset, and to scan, in response to the number of read operations for a first tracked subset exceeding a first threshold value, a portion of data corresponding to each word line of the first tracked subset to determine an error count corresponding to each word line of the first tracked subset.

18 Claims, 6 Drawing Sheets

(56) References Cited

U.S. PATENT DOCUMENTS

| | | | |
|---|---|---|---|
| 2015/0117107 A1* | 4/2015 | Sun | G11C 16/10 365/185.12 |
| 2015/0370701 A1* | 12/2015 | Higgins | G06F 12/0253 711/103 |
| 2016/0041891 A1* | 2/2016 | Malshe | G06F 11/2094 714/704 |
| 2016/0117216 A1* | 4/2016 | Muchherla | G06F 11/08 714/6.11 |
| 2016/0118132 A1* | 4/2016 | Prins | G11C 16/26 714/704 |
| 2016/0342458 A1* | 11/2016 | Cai | G11C 29/44 |
| 2017/0300256 A1* | 10/2017 | Kashyap | G06F 3/0619 |
| 2018/0182465 A1* | 6/2018 | Alhussien | G06F 11/10 |
| 2018/0293002 A1* | 10/2018 | Bradshaw | G06F 3/0616 |
| 2018/0293005 A1* | 10/2018 | Bradshaw | G06F 3/0619 |

\* cited by examiner

METHODS OF ERROR-BASED READ DISTURB MITIGATION AND MEMORY DEVICES UTILIZING THE SAME

TECHNICAL FIELD

The present disclosure generally relates to semiconductor memory devices, and more particularly relates to methods of read disturb mitigation and memory devices employing the same.

BACKGROUND

Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), resistive random access memory (RRAM), and magnetic random access memory (MRAM), among others.

Flash memory devices can include an array of memory cells that each store data in a charge storage structure, such as a conductive floating gate or a dielectric charge trap. Flash memory devices frequently use a one-transistor memory cell that allows for high memory densities, high reliability, and low power consumption during use. Memory cells in a flash memory device can be programmed to a target state to represent information. For instance, electric charge can be placed on, or removed from, the charge storage structure (e.g., the charge trap or the floating gate) of a memory cell to program the cell to a particular data state. The data state can subsequently be read back from the memory cell by measuring a resistance of a circuit including the cell to determine the amount of charge on the charge storage structure.

Given the high density of flash memory cells, operations (e.g., reads, writes, erasures) on one memory cell can impact the charge stored on adjacent or nearby cells. One such effect is known as "read disturb," in which a read operation performed on memory cells connected to one word line can change the amount of charge stored in memory cells on other word lines (e.g., the adjacent or nearby word lines) in the same memory block.

One approach to address this problem involves tracking the number of read operations that have occurred in a memory block (spanning multiple word lines) so that the data therein can be pre-emptively relocated to a different memory block before the number of read operations reaches levels that can cause data loss. This approach requires characterizing a number of read operations which can be safely performed on a memory block. This characterization poses a challenge, however, as the number of read operations that can be safely performed on a memory block depends upon the distribution of the read operations within the memory block. For example, in a memory block in which the read operations are evenly distributed across word lines, the number of read operations that could safely be performed would be fairly high, whereas in a memory block in which the read operations are concentrated on one or a few word lines, the number of read operations that could safely be performed would be fairly low. Choosing a single threshold value of read operations for every memory block in a device, therefore, will provide poor performance where some memory blocks experience more evenly distributed read disturb effects and others experience more localized read disturb effects on just a few word lines. Accordingly, a way to more efficiently address the localized effects of read disturb is required.

BRIEF SUMMARY

Figure 1:
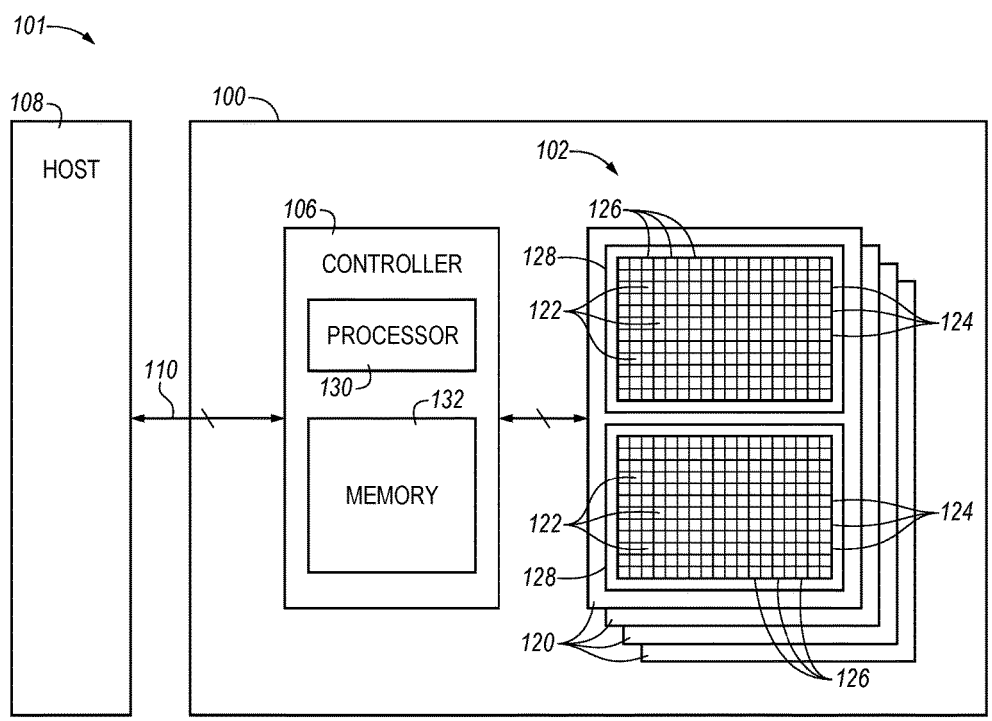
FIG. 1 is a block diagram of a system having a memory device configured in accordance with an embodiment of the present technology.

Embodiments of the present disclosure relate to a memory device comprising a main memory and a controller operably connected to the main memory. The main memory can comprise a plurality of memory addresses, each corresponding to a single one of a plurality of word lines. Each memory address can be included in a tracked subset of the plurality of memory addresses. Each tracked subset can include memory addresses corresponding to more than one of the plurality of word lines. The controller is configured to track a number of read operations for each tracked subset, and to scan, in response to the number of read operations for a first tracked subset exceeding a first threshold value, a portion of data corresponding to each word line of the first tracked subset to determine an error count corresponding to each word line of the first tracked subset.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory devices are not shown, or are not described in detail, to avoid obscuring other aspects of the technology. For example, several functional components of memory devices and/or memory systems that are well-known to those skilled in the art are not discussed in detail below (e.g., circuit components such as multiplexers and decoders, data structures such as address registers and data registers, etc.). In general, it should be understood that various other devices, systems, and methods in addition to those specific embodiments disclosed herein may be within the scope of the present technology.

As discussed above, read disturb effects in flash memory can cause data loss if not addressed in a timely fashion, such that ever more efficient methods of mitigating read disturb effects are desired. Accordingly, several embodiments of memory devices in accordance with the present technology can perform word line scans to detect localized read disturb effects before they become problematic (e.g., before uncorrectable bit errors occur). The word line scan can determine an error count (e.g., an RBER) for each word line in a tracked subset of memory addresses (e.g., a single memory block, a group of memory blocks, a memory superblock, a group of word lines corresponding to less than a memory block, etc.) and outputs a value corresponding to the error count of the word line with the highest error count (e.g. the word line that has experienced the largest amount of read disturb effects). If the word line scan reveals an amount of errors that indicates that the data in the tracked subset is experiencing levels of read disturb effects that can cause errors, then a relocation operation can be performed or scheduled for future performance.

Several embodiments of the present technology are directed to memory devices, systems including memory devices, and methods of operating memory devices. In one embodiment, a memory device comprises a main memory and a controller operably connected to the main memory. The main memory can comprise a plurality of memory addresses, each corresponding to a single one of a plurality of word lines. Each memory address can be included in a tracked subset of the plurality of memory addresses. Each tracked subset can include memory addresses corresponding to more than one of the plurality of word lines. The controller is configured to track a number of read operations for each tracked subset, and to scan, in response to the number of read operations for a first tracked subset exceeding a first threshold value, a portion of data corresponding to each word line of the first tracked subset to determine an error count corresponding to each word line of the first tracked subset.

FIG. 1 is a block diagram of a system 101 having a memory device 100 configured in accordance with an embodiment of the present technology. As shown, the memory device 100 includes a main memory 102 (e.g., NAND flash, NOR flash, chalcogenide PCM, etc.) and a controller 106 operably coupling the main memory 102 to a host device 108 (e.g., an upstream central processor (CPU)). The main memory 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory cells 122 can include, for example, floating gate, charge trap, phase change, ferroelectric, magnetoresistive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Each word line can include one or more memory pages, depending upon the number of data states the memory cells 122 of that word line are configured to store. For example, a single word line of memory cells 122 in which each memory cell 122 is configured to store one of two data states (e.g., SLC memory cells configured to store one bit each) can include a single memory page. Alternatively, a single word line of memory cells 122 in which each memory cell 122 is configured to store one of four data states (e.g., MLC memory cells configured to store two bits each) can include two memory pages. Moreover, memory pages can be interleaved so that a word line comprised of memory cells 122 in which each memory cell 122 is configured to store one of two data states (e.g., SLC memory cells) can span two memory pages, in an "even-odd bit line architecture," where all the memory cells 122 in odd-numbered columns 126 of a single word line are grouped as a first memory page, and all the memory cells 122 in even-numbered columns 126 of the same word line are grouped as a second memory page. When even-odd bit line architecture is utilized in a word line of memory cells 122 in which each memory cell 122 is configured to store larger numbers of data states (e.g., memory cells configured as MLC, TLC, QLC, etc.), the number of memory pages per word line can be even higher (e.g., 4, 6, 8, etc.).

Each column 126 can include a string of series-coupled memory cells 122 connected to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 100 can include only one memory unit 120. Alternatively, memory device 100 can include two, three, four, eight, ten, or more (e.g., 16, 32, 64, or more) memory units 120. Although the memory units 120 are shown in FIG. 1 as including two memory blocks 128 each, in other embodiments, each memory unit 120 can include one, three, four eight, or more (e.g., 16, 32, 64, 100, 128, 256 or more memory blocks). In some embodiments, each memory block 128 can include, e.g., $2^{15}$ memory pages, and each memory page within a block can include, e.g., $2^{12}$ memory cells 122 (e.g., a "4k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory device 100, including managing the main memory 102 and handling communications between the memory device 100 and the host device 108. In some embodiments, the embedded memory 132 can include memory registers storing, e.g., memory pointers, fetched data, etc. The embedded memory 132 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 1, memory device 100 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the main memory 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 1).

The controller 106 communicates with the host device 108 over a host-device interface 110. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 108 can be any one of a number of electronic devices capable of utilizing memory for the temporary or persistent storage of information, or a component thereof. For example, host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 108 may be a networking device (e.g., a switch, a router, etc.) or a recorder of digital images, audio and/or video, a vehicle, an appliance, a toy, or any one of a number of other products. In one embodiment, host device 108 may be connected directly to memory device 100, although in other embodiments, host device 108 may be indirectly connected to memory device (e.g., over a networked connection or through intermediary devices).

Figure 2:
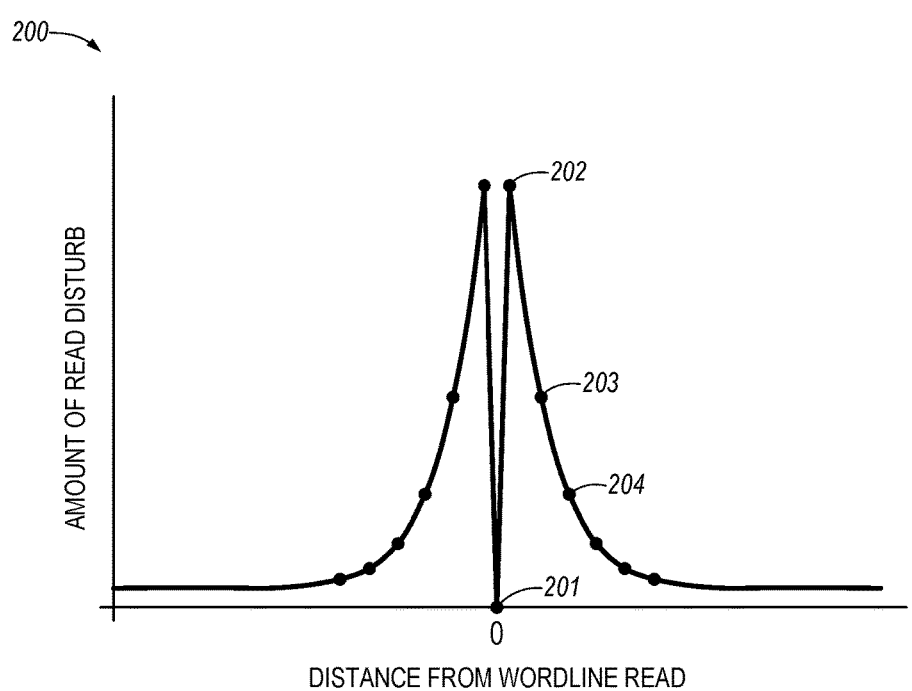
FIG. 2 is a plot of localized read disturb effects experienced by a memory device configured in accordance with an embodiment of the present technology.

As set forth in greater detail above, read operations on a memory array can cause read disturb effects to memory cells on word lines adjacent to the memory cell that is the target of a read operation. FIG. 2 is a plot 200 of localized read disturb effects experienced by a memory device configured in accordance with an embodiment of the present technology. As can be seen with reference to FIG. 2, a memory cell (or memory page) 201 targeted for a read operation does not itself experience read disturb effects. Rather, due to the read-pass voltage applied to other the word lines in the same memory block as the word line being read, the read disturb effects accrue to the other word lines. The effects are not evenly distributed across the other word lines in the same memory block, however. Due in part to the increasing density of flash memory arrays, the difference between the read pass voltage applied to non-selected word lines and the read voltage applied to a selected word line increases the read disturb effect for unselected word lines that are in close proximity to the selected word line. In the plot 200 of FIG. 2, this can be observed in the amount of read disturb experienced at an unselected word line 202 immediately adjacent to the selected word line 201, when compared to more distant word lines 203 and 204. Accordingly, if a large number of read operations target memory cells on the same word line of a memory block, the cumulative read disturb effects on nearby or adjacent word lines can cause uncorrectable bit errors sooner than if read operations were distributed more evenly across word lines in the memory block.

One approach to address this challenge involves lowering the number of read count operations permitted on a memory block before a copy-and-erase or other relocation operation is triggered. This approach can be inefficient, as setting the threshold value for every memory block based on a worst-case scenario of highly localized read disturb effects would trigger premature relocation operations on blocks with more evenly distributed read disturb effects. Frequent erase operations (e.g., as part of relocation operations) can degrade both the performance (e.g., due to more frequent garbage collection operations) and useful life (e.g., as flash devices frequently have a lifespan limited by a maximum number of erase operations per block) of the memory device so configured.

Another approach involves tracking read operations with greater granularity (e.g., at the word line level). Given the large number of word lines that each memory block can span (e.g., 128, 256, 512, 1024, etc.), increasing the tracking granularity in this way can be cost-prohibitive. For example, in a memory device in which each memory block spans 128 word lines, tracking read counts for each word line rather than for each memory block would increase the space required to store the tracked read counts by about two orders of magnitude.

Accordingly, the present technology provides a method for performing word line scans to detect localized read disturb effects before they become problematic (e.g., before uncorrectable bit errors occur). The word line scan determines an error count (e.g., an RBER) for each word line in a tracked subset of memory addresses (e.g., a single memory block, a group of memory blocks, a group of word lines corresponding to less than a memory block, etc.) and outputs a value corresponding to the error count of the word line or lines with the highest count (e.g. the word line that has experienced the largest amount of read disturb effects). If the word line scan reveals an amount of errors that indicates that the data in the tracked subset is experiencing levels of read disturb effects that can cause errors, then a relocation operation can be performed or scheduled for future performance.

In accordance with one aspect of the present technology, a word line scan does not have to read all of the data on each word line in the tracked subset to provide an error count corresponding to each word line. Rather, the word line scan can be configured to exploit the architectural characteristics of the memory device on which the scan is performed. For example, where multiple pages are stored on the same word line (e.g., in an even-odd architecture, or in an MLC, TLC, QLC, or even higher number of bits-per-cell architecture), a single page can be read from each word line. In other embodiments, in which the memory device is capable of performing read operations at a sub-page level (e.g., reading a single allocation unit from a page), then the word line scan can be performed at that sub-page level. Reducing the amount of data that is read from each word line during the word line scan can improve the speed of the scanning.

Figure 3:
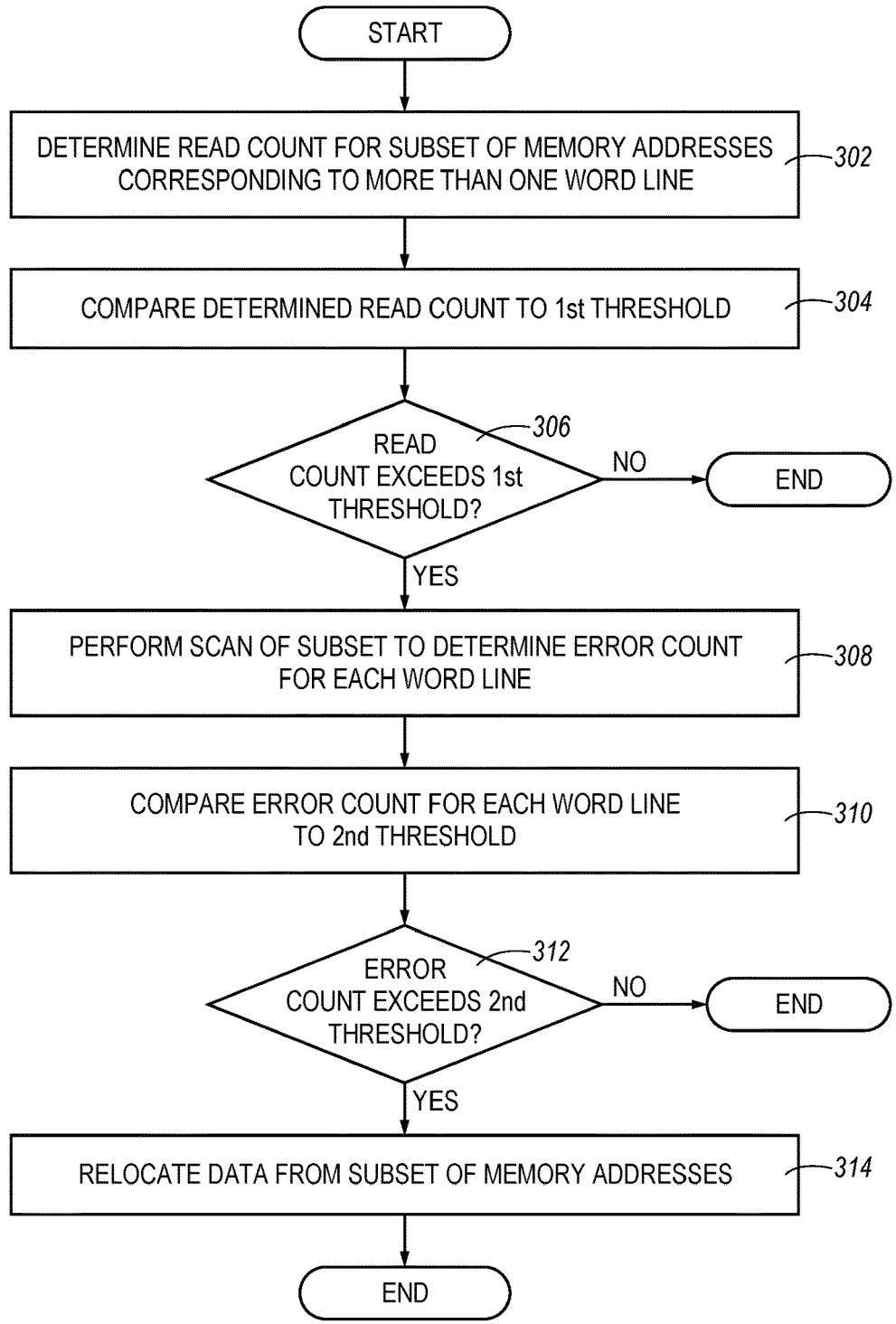
FIG. 3 is a flow chart illustrating a method of managing a memory device in accordance with an embodiment of the present technology.

FIG. 3 is a flow chart illustrating a method of managing a memory device in accordance with one embodiment of the present technology. The method includes determining (block 302) a read count for a tracked subset of memory addresses corresponding to more than one word line (e.g., a subset of the memory addresses of the memory device corresponding to a single memory block, to multiple memory blocks, to a memory superblock, to a plurality of pages across a number of word lines comprising less than a memory block, etc.). For example, the read count for each tracked subset can be stored in a table managed (e.g., tracked) by the memory controller for the memory device implementing the method. The determining (block 302) can be performed in response to a read operation (e.g., in response to a read command received from a connected host), or can alternatively be performed as part of background memory management operations. The method includes comparing (box 304) the determined read count to a first threshold value to evaluate (box 306) whether the determined read count meets and/or exceeds the first threshold value. If the evaluation (box 306) determines that the read count does not yet meet and/or exceed the first threshold value, the method can end (e.g., if the method is triggered in response to a read operation, the read operation can continue as normal, or if the method is part of background operations, the background scanning can proceed to the next tracked subset of memory addresses).

If, however, the evaluation (box 306) determines that the read count exceeds the first threshold value, the method can include performing a word line scan (box 308) of the tracked subset to determine an error count (e.g., a count of correctable bit errors) corresponding to each word line in the tracked subset. The determined error count can then be compared (box 310) to a second threshold value (e.g., a maximum allowable error count based on an ECC capability of the memory device) to evaluate whether the determined error count meets and/or exceeds the second threshold value (box 312). If the evaluation (box 312) determines that the error count does not yet meet and/or exceed the second threshold value, the method can end (e.g., if the method is triggered in response to a read operation, the read operation can continue as normal, or if the method is part of background operations, the background scanning can proceed to the next tracked subset of memory addresses). If, however, the evaluation (box 312) determines that the error count exceeds the second threshold value, the method can include relocating (box 314) data from the tracked subset of memory addresses (e.g., with a copy-and-erase operation) to prevent the data from being corrupted by additional read disturb effects (box 314). The relocation (box 314) can occur immediately, or it can be scheduled for future performance (e.g., added to a list of blocks to be relocated in a background operation).

In accordance with one embodiment of the subject technology, the first threshold value (e.g., corresponding to a number of read counts that can occur before a word line scan is performed) can remain constant for a life of the memory device, and be configured at a time of manufacturing or provisioning. In accordance with another embodiment of the subject technology, the first threshold value can change over time to accommodate the increasing susceptibility of a memory device to read disturb errors over the life of the memory device. In this regard, as a memory device begins to wear out from a growing number of cumulative erase operations, the susceptibility of the memory device to read disturb effects increases, such that a first threshold value that is reduced over time (e.g., as measured by a number of erase operations) can provide improved performance. In accordance with another aspect of the subject technology, the first threshold value can be user-configurable, or otherwise adjustable by a host device.

Moreover, although the foregoing embodiments have been described with reference to a single first threshold value (e.g., corresponding to a number of read counts that can occur before a word line scan is performed) that corresponds to all of the tracked subsets of memory addresses of a memory device, in other embodiments a memory device can track multiple first threshold values, each corresponding to one or more tracked subsets. In a memory device employing this approach, the first threshold value corresponding to each tracked subset can also be adjusted based on a total erase count for that tracked subset, or otherwise user- or host-configurable.

In accordance with an aspect of the subject technology, although a word line scan does not need to read all of the data from each word line in a tracked subset (e.g., reading only a single page, a single allocation unit, or some other minimal amount of data that the memory architecture permits to be read), the scan can utilize a non-negligible amount of device resources (e.g., time, power, etc.). Therefore, in accordance with one embodiment of the present technology, a word line scan can be scheduled in any one of a variety of different ways configured to achieve a more efficient balance of costs and benefits. For example, the word line scans can be scheduled to be performed with some regular periodicity after the number of reads on a tracked subset of memory addresses has become high enough that a localized disturb effect may have begun to occur (e.g., at a threshold number of read operations on the tracked subset that could cause problematic read disturb effects if the read operations had been concentrated on a single word line). In this regard, the word line scans can be performed after every n read operations on a tracked subset (e.g., where n is an integer number of read operations, such as 100, 1000, 10000, 32768, etc.) after the tracked subset has experienced a cumulative count of read operations (e.g., since a last erase operation on the tracked subset) above a predetermined threshold (e.g., the first threshold value). This can be facilitated by increasing the first threshold value corresponding to a tracked subset of memory addresses by a fixed amount following a determination (e.g., in box 312 of FIG. 3) that the determined error count for that tracked subset does not yet exceed the second threshold (and resetting the first threshold value for that tracked subset to an initial value following an erase operation on the tracked subset).

In accordance with another embodiment, the output from a word line scan can be utilized to more efficiently schedule a subsequent word line scan on the same tracked subset. For example, after performing a word line scan that determines an error count below the second threshold value for triggering a relocation operation (e.g., where a number of bit errors on a most-disturbed word line is still well within the ECC capability of the memory device), the number of read counts that can be performed on that particular tracked subset before the next scan occurs can be increased by an amount corresponding to the detected error count. This scheduling approach allows the next word line scan for the same tracked subset to be deferred by a large number of read operations when read disturb effects are more evenly distributed (e.g., in a tracked subset where the read operations have been distributed across the word lines), and by a smaller number of read operations when read disturb effects are more localized (e.g., in a tracked subset where the read operations have been concentrated on one or a few word lines). Although this scheduling approach involves maintaining a different first threshold value for each tracked subset of memory addresses, it provides the benefit of tailoring a word line scanning schedule more particularly suited to the activity profile of each tracked subset.

Figure 4:
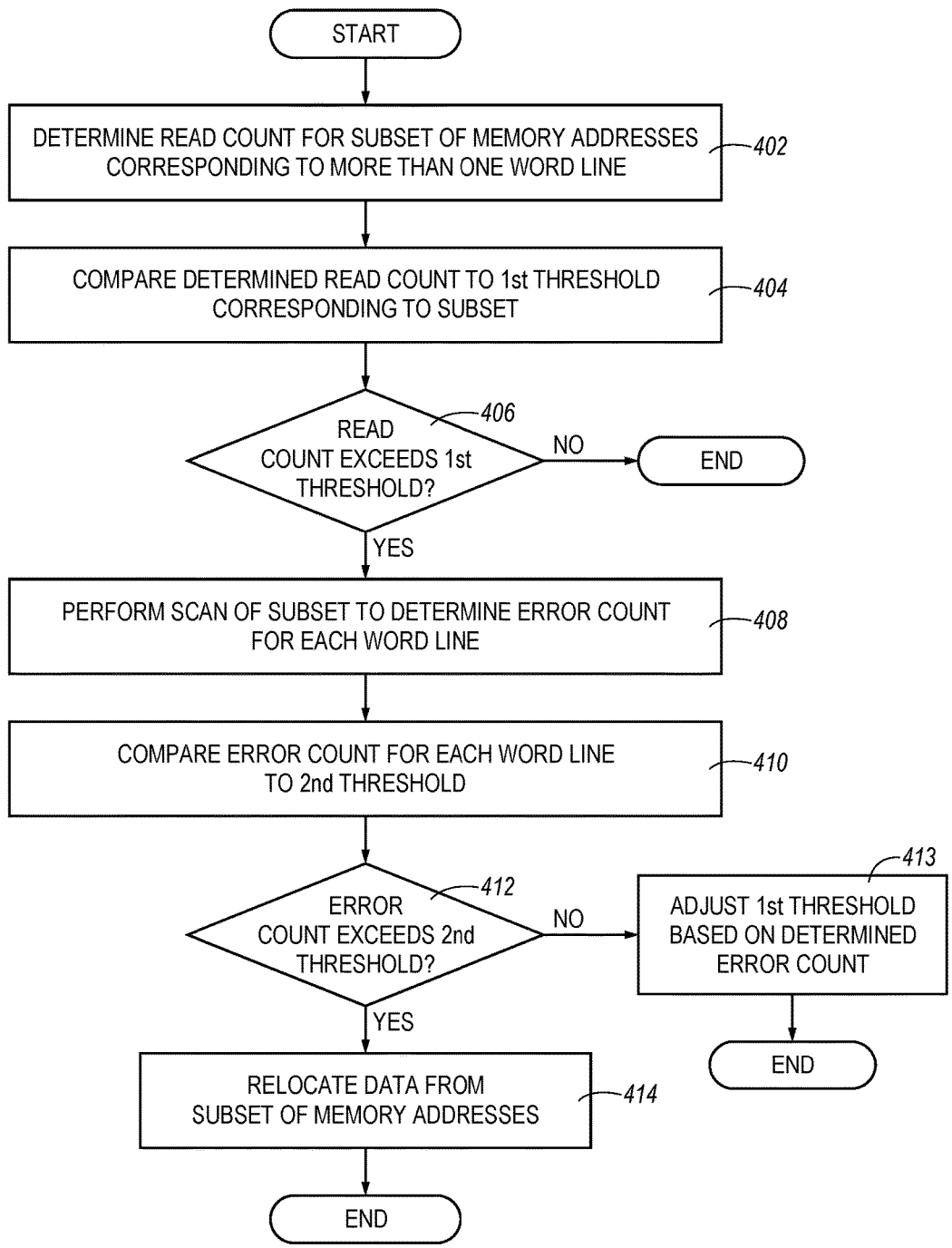
FIG. 4 is a flow chart illustrating a method of managing a memory device in accordance with an embodiment of the present technology.

FIG. 4 is a flow chart illustrating a method of managing a memory device in accordance with one embodiment of the present technology, in which the output of the word line scan is used in the scheduling of the next word line scan. The method includes determining (block 402) a read count for a tracked subset of memory addresses corresponding to more than one word line (e.g., a subset of the memory addresses of the memory device corresponding to a single memory block, to multiple memory blocks, to a memory superblock, to a plurality of pages across a number of word lines comprising less than a memory block, etc.). For example, the read count for each tracked subset can be stored in a table managed (e.g., tracked) by the memory controller for the memory device implementing the method. The determining (block 402) can be performed in response to a read operation (e.g., in response to a read command received from a connected host), or can alternatively be performed as part of background memory management operations. The method includes comparing (box 404) the determined read count to a first threshold value that corresponds to the tracked subset to evaluate (box 406) whether the determined read count meets and/or exceeds the first threshold value. If the evaluation (box 406) determines that the read count does not yet meet and/or exceed the first threshold value, the method can end (e.g., if the method is triggered in response to a read operation, the read operation can continue as normal, or if the method is part of background operations, the background scanning can proceed to the next tracked subset of memory addresses).

If, however, the evaluation (box 406) determines that the read count exceeds the first threshold value, the method can include performing a word line scan (box 408) of the tracked subset to determine an error count (e.g., a count of correctable bit errors) corresponding to each word line in the tracked subset. The determined error count can then be compared (box 410) to a second threshold value (e.g., a maximum allowable error count based on an ECC capability of the memory device) to evaluate (box 412) whether the determined error count meets and/or exceeds the second threshold value. If the evaluation (box 412) determines that the error count exceeds the second threshold value, the method can include relocating (box 414) data from the tracked subset of memory addresses (e.g., with a copy-and-erase operation) to prevent the data from being corrupted by additional read disturb effects. The relocation (box 414) can occur immediately, or it can be scheduled for future performance (e.g., added to a list of blocks to be relocated in a background operation).

If, however, the evaluation (box 412) determines that the error count does not yet meet and/or exceed the second threshold value, the method can include adjusting (box 413) the first threshold value based on the determined error count. For example, if the determined error count is less than half of the second threshold value, the first threshold value may be increased by a larger amount (e.g., permitting another 10000 read operations to occur before the word line scan for the current tracked subset is performed again), whereas if the determined error count is greater than or equal to half of the second threshold value, the first threshold value may be increased by a smaller amount (e.g., only permitting another 2000 read operations to occur before the word line scan for the current tracked subset is performed again). A memory device employing this method can maintain a table correlating determined error counts to amounts by which to increase the first threshold value similar to Table 1, below:

TABLE 1

| Determined Error Count | Amount by which to Increase First Threshold Value |
|---|---|
| 0-20 | 524,288 (i.e., $2^{18}$) |
| 21-40 | 262,144 (i.e., $2^{17}$) |
| 41-80 | 131,072 (i.e., $2^{16}$) |
| 81-100 | 65,536 (i.e., $2^{15}$) |
| 101-150 | 32,768 (i.e., $2^{14}$) |
| 151-210 | 16,384 (i.e., $2^{13}$) |

In another embodiment, rather than increasing the first threshold value for the tracked subset by a fixed increment, the method can increase the first threshold value by a multiple or percentage of its current value. A memory device employing this approach can maintain a table correlating determined error counts to multiples by which to increase the first threshold value similar to Table 2, below:

TABLE 2

| Determined Error Count | Multiple by which to Increase First Threshold Value |
|---|---|
| 0-40 | 2.00 |
| 41-100 | 1.75 |
| 101-150 | 1.50 |
| 151-210 | 1.25 |

As set forth above, tracking a threshold number of read operations for each tracked subset of memory addresses requires more storage space than maintaining a single threshold value applied to all of the tracked subsets. Given the large number of read operations that may occur on some memory devices before read disturb effects become problematic (e.g., measuring in the tens of thousands, hundreds of thousands, or even millions of read operations), the number of bits required to store the threshold values can be large. In accordance with another embodiment of the present technology, rather than storing a threshold value for each tracked subset of memory addresses, a memory device can be configured to store a scaling factor for each tracked subset of memory addresses, and to calculate the threshold value from the scaling factor "on-the-fly." In this regard, storing a scaling factor that requires fewer bits (e.g., less than 16, or less than 8, or even less than 4) reduces the storage requirements for tracking a separate threshold value for each tracked subset, at a cost of increased computational complexity (e.g., the threshold value can be calculated in response to each read operation as an offset added to a single threshold value for the memory device, where the offset is calculated by multiplying the scaling factor with the single threshold). Accordingly, rather than increasing a threshold value of read operations in response to an error count determined by the word line scan, a scaling factor corresponding to the tracked subset can be increased instead, as set forth in greater detail below.

Figure 5:
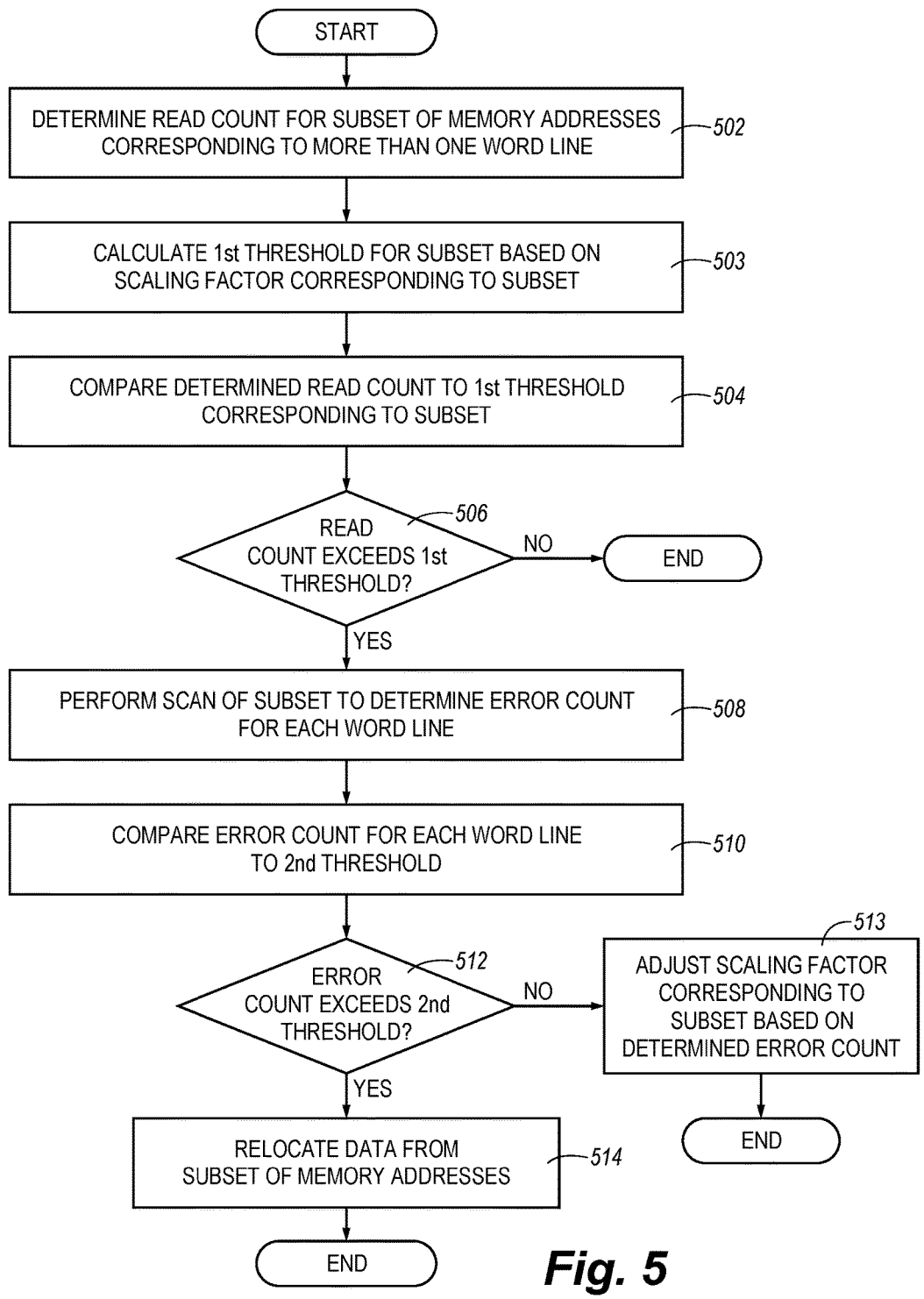
FIG. 5 is a flow chart illustrating a method of managing a memory device in accordance with an embodiment of the present technology.

FIG. 5 is a flow chart illustrating a method of managing a memory device in accordance with one embodiment of the present technology, in which the output of the word line scan is used in the scheduling of the next word line scan. The method includes determining (block 502) a read count for a tracked subset of memory addresses corresponding to more than one word line (e.g., a subset of the memory addresses of the memory device corresponding to a single memory block, to multiple memory blocks, to a memory superblock, to a plurality of pages across a number of word lines comprising less than a memory block, etc.). For example, the read count for each tracked subset can be stored in a table managed (e.g., tracked) by the memory controller for the memory device implementing the method. The determining (block 502) can be performed in response to a read operation (e.g., in response to a read command received from a connected host), or can alternatively be performed as part of background memory management operations. The method includes calculating (box 503) a first threshold value corresponding to the tracked subset based on a scaling factor that corresponds to the tracked subset (e.g., the threshold value can be calculated in response to each read operation as an offset added to a single threshold value for the memory device, where the offset is calculated by multiplying the scaling factor with the single threshold). The method further includes comparing (box 504) the determined read count to the first threshold value to evaluate (box 506) whether the determined read count meets and/or exceeds the first threshold value. If the evaluation (box 506) determines that the read count does not yet meet and/or exceed the first threshold value, the method can end (e.g., if the method is triggered in response to a read operation, the read operation can continue as normal, or if the method is part of background operations, the background scanning can proceed to the next tracked subset of memory addresses).

If, however, the evaluation (box 506) determines that the read count exceeds the first threshold value, the method can include performing a word line scan (box 508) of the tracked subset to determine an error count (e.g., a count of correctable bit errors) corresponding to each word line in the tracked subset. The determined error count can then be compared (box 510) to a second threshold value (e.g., a maximum allowable error count corresponding to a value within the ECC capability of the memory device) to evaluate (box 512) whether the determined error count meets and/or exceeds the second threshold value. If the evaluation (box 512) determines that the error count meets and/or exceeds the second threshold value, the method can include relocating data (box 514) from the tracked subset of memory addresses (e.g., with a copy-and-erase operation) to prevent the data from being corrupted by additional read disturb effects. The relocation (box 514) can occur immediately, or it can be scheduled for future performance (e.g., added to a list of blocks to be relocated in a background operation).

If, however, the evaluation (box 512) determines that the determined error count does not yet meet and/or exceed the second threshold value, the method can include adjusting (box 513) the scaling factor corresponding to the tracked subset based on the determined error count. For example, if the determined error count is less than half of the second threshold value, the scaling factor may be increased by a larger amount (e.g., thereby increasing the number of read operations permitted to occur before the word line scan for the current tracked subset is performed again by, e.g., 10%), whereas if the determined error count is greater than or equal to half of the second threshold value, the scaling factor may be increased by a smaller amount (e.g., thereby increasing the number of read operations permitted to occur before the word line scan for the current tracked subset is performed again by, e.g., 5%). A memory device employing this approach can maintain a table correlating determined error counts to amounts by which to increase the scaling factor similar to Table 3, below:

TABLE 3

| Determined Error Count | Amount by which to Increase Scaling Factor |
|---|---|
| 0-15 | 1.00 |
| 16-31 | 0.75 |
| 32-63 | 0.50 |
| 64-127 | 0.20 |
| 128-191 | 0.10 |
| 192-256 | 0.05 |

For example, a table correlating each tracked subset with a corresponding scaling factor can be initialized so that each entry has a value of 1.0. Accordingly, when calculating a specific first threshold value for a particular tracked subset of memory addresses, the calculated value will be equal to the scaling factor (1.0) multiplied with a threshold value for the memory device (e.g., and optionally updated over time with regard to the total erase count for the memory device). If the word line scan for the first subset outputs a determined error count of less than 25, then the scaling factor for that tracked subset can be increased by 0.75 (per the correlation in Table 3). Accordingly, the next word line scan for that tracked subset will not be triggered until the read count for that tracked subset meets or exceeds a threshold value equal to 1.75 multiplied with the threshold value for the memory device. If that next word line scan determines an error count of 85, then the scaling factor for the tracked subset can be increased by a further 0.20 (per the correlation in Table 3), such that the next word line scan will not be triggered until the read count for that tracked subset meets or exceeds a threshold value equal to 1.95 multiplied with the threshold value for the memory device, and so on.

Figure 6:
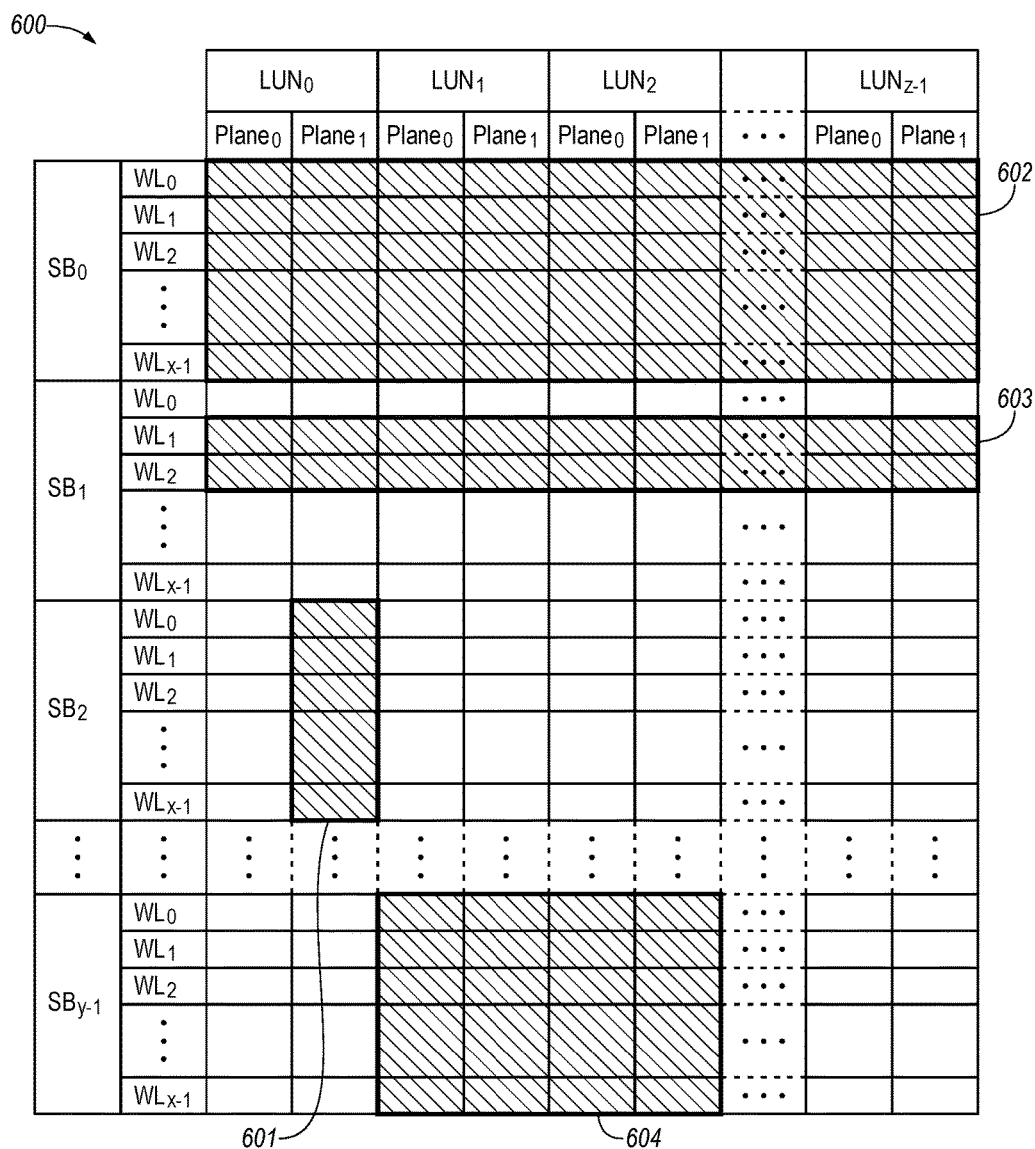
FIG. 6 is a schematic representation of various tracked subsets of memory addresses of a memory device in accordance with embodiments of the present technology.

As set forth in greater detail above, embodiments of the present technology include memory devices that can track read counts (and optionally erase counts, threshold levels, and/or scaling factors) corresponding to subsets of memory addresses at various granularities (e.g., a single memory block, a group of memory blocks, a group of word lines corresponding to less than a memory block, etc.), so that word line scans can be performed on the tracked subset based in part upon the read count for the tracked subset reaching a threshold value. FIG. 6 is a schematic representation of the scale of various tracked subsets of memory addresses of a memory device in accordance with embodiments of the present technology. As can be seen with reference to FIG. 6, a memory array 600 can include a plurality of memory planes organized into logical unit numbers (LUNs), such as $LUN_0$ to $LUN_{z-1}$. Each memory plane can include a number of memory pages connected to a number of word lines (WLs) grouped into a number of super blocks (SBs), such as $SB_0$ to $SB_{y-1}$, each comprising $WL_0$ to $WL_{x-1}$. The scale of the subset of memory addresses that is tracked by the memory device including memory array 600 can be selected to optimize a balance of storage required (e.g., more tracked subsets consuming more storage to track the read counts thereof) and performance (e.g., more tracked subsets providing greater efficiency in delaying copy-and-erase or other relocation operations closer to a maximum read disturb endurance for the tracked subset).

For example, the tracked subsets can correspond to physical memory blocks, such as physical memory block 601. Alternatively, the tracked subsets can correspond to super blocks, such as super block $SB_0$ (shown in outline with reference number 602). One of skill in the art will readily understand, however, that the scale of the tracked subsets need not be integer numbers of physical blocks, as in the foregoing two examples. Any subset of memory addresses that include memory addresses associated with multiple word lines can be tracked and subject to word line scans, as set forth in greater detail above, including sub-superblock groups of word lines such as group 603, or sub-superblock groups of physical blocks such as group 604. These subsets could be even further subdivided to provide more granular subsets, such as a subset of group 604 that included only those memory addresses associated with word lines $WL_0$ through $WL_2$.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A memory device, comprising:
    a main memory comprising a plurality of memory addresses, each memory address corresponding to a single one of a plurality of word lines and being included in a tracked subset of the plurality of memory addresses, each tracked subset including memory addresses corresponding to more than one of the plurality of word lines; and
    a controller operably connected to the main memory and configured to:
        track, for each tracked subset, a number of read operations,
        scan, in response to the number of read operations for a first tracked subset exceeding a first threshold value corresponding to the first tracked subset, a portion of data corresponding to each word line of the first tracked subset to determine an error count corresponding to each word line of the first tracked subset, and
        update the first threshold value by an amount corresponding to the determined error count.

2. The memory device of claim 1, wherein the tracked subset is one of: a memory block, a memory superblock, or a set of memory blocks comprising a subset of a memory superblock.

3. The memory device of claim 1, wherein the portion of data corresponding to each word line is a memory page from each word line of the first tracked subset.

4. The memory device of claim 1, wherein the portion of data corresponding to each word line is an allocation unit from each word line of the first tracked subset.

5. The memory device of claim 1, wherein the controller is further configured to:
    relocate data from the tracked subset if the error count is determined to exceed a second threshold value.

6. The memory device of claim 1, wherein the controller is configured to update the first threshold value by adjusting a threshold scaling factor corresponding to the first tracked subset based on the determined error count.

7. The memory device of claim 6, wherein the controller is further configured to:
    calculate the first threshold value based on the threshold scaling factor before scanning.

8. The memory device of claim 1, wherein the first threshold value corresponds at least in part to a number of erase operations performed on the first tracked subset.

9. The memory device of claim 1, wherein the main memory is a flash memory.

10. A method of managing a memory device having a plurality of memory addresses, each memory address corresponding to a single one of a plurality of word lines and being included in a tracked subset of the plurality of memory addresses, each tracked subset including memory addresses corresponding to more than one of the plurality of word lines, the method comprising:
    tracking, for each tracked subset, a number of read operations,
    scanning, in response to the number of read operations for a first tracked subset exceeding a first threshold value corresponding to the first tracked subset, a portion of data corresponding to each word line of the first tracked subset to determine an error count corresponding to each word line of the first tracked subset, and
    updating the first threshold value by an amount corresponding to the determined error count.

11. The method of claim 10, wherein the tracked subset is one of: a memory block, a memory superblock, or a set of memory blocks comprising a subset of a memory superblock.

12. The method of claim 10, wherein the portion of data corresponding to each word line is a memory page from each word line of the first tracked subset.

13. The method of claim 10, wherein the portion of data corresponding to each word line is an allocation unit from each word line of the first tracked subset.

14. The method of claim 10, further comprising:
    relocating data from the tracked subset if the error count is determined to exceed a second threshold value.

15. The method of claim 10, wherein the updating comprises adjusting a threshold scaling factor corresponding to the first tracked subset based on the determined error count.

16. The method of claim 15, further comprising:
    calculating the first threshold value based on the threshold scaling factor before scanning.

17. The method of claim 10, wherein the main memory is a flash memory.

18. A memory device, comprising:
    a main memory comprising a plurality of memory addresses, each memory address corresponding to a single one of a plurality of word lines and being included in a tracked subset of the plurality of memory addresses, each tracked subset including memory addresses corresponding to more than one of the plurality of word lines; and
    a controller operably connected to the main memory and configured to:
        scan a portion of data corresponding to each word line of the first tracked subset to determine an error count corresponding to each word line of the first tracked subset, and
        schedule a subsequent scan for the first tracked subset to occur after a number of read operations are performed on the first tracked subset, wherein the number is based on the determined error count.

* * * * *